US012588559B2

(12) United States Patent
Lin et al.

(10) Patent No.: US 12,588,559 B2
(45) Date of Patent: Mar. 24, 2026

(54) DISPLAY PANEL, TILED DISPLAY DEVICE INCLUDING THE SAME, AND MANUFACTURING METHOD THEREOF

(71) Applicant: AUO Corporation, Hsin-Chu (TW)

(72) Inventors: Yi-Hsin Lin, Hsin-Chu (TW);
Wen-Lung Chen, Hsin-Chu (TW);
Wei-Lung Liau, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 585 days.

(21) Appl. No.: 18/091,465

(22) Filed: Dec. 30, 2022

(65) Prior Publication Data

US 2023/0253409 A1 Aug. 10, 2023

(30) Foreign Application Priority Data

Feb. 10, 2022 (TW) .................................. 111104872

(51) Int. Cl.
*H01L 27/12* (2006.01)
*H01L 25/16* (2023.01)
(Continued)

(52) U.S. Cl.
CPC ........ *H10W 90/00* (2026.01); *H10D 86/0212* (2025.01); *H10D 86/411* (2025.01);
(Continued)

(58) Field of Classification Search
CPC .... H10H 29/45; H01L 25/0753; H01L 25/167
See application file for complete search history.

(56) References Cited

U.S. PATENT DOCUMENTS 11,322,489 B2 5/2022 Huang et al.
2012/0241810 A1 9/2012 Wang
(Continued)

FOREIGN PATENT DOCUMENTS

CN 102982744 A * 3/2013 ......... H01L 25/0753
CN 110391200 A 10/2019
(Continued)

OTHER PUBLICATIONS

Machine translation, Sun, Chinese Pat. Pub. No. CN102982744A, translation date: Aug. 7, 2025, Espacenet, all pages. (Year: 2025).*
(Continued)

*Primary Examiner* — Victoria K. Hall
(74) *Attorney, Agent, or Firm* — Tim Tingkang Xia, Esq.; Troutman Pepper Locke LLP

(57) ABSTRACT

A display panel includes a first substrate, a second substrate, a plurality of light-emitting components, a bonding layer and a driving component. The first substrate includes a planar portion and a bending portion. The second substrate is disposed on the first substrate. The light-emitting components are disposed on the second substrate. The bonding layer is disposed between the planar portion of the first substrate and the second substrate. The driving component is disposed on a first surface of the bending portion of the first substrate and electrically connected to the light-emitting components. The first surface of the bending portion extends from a surface of the planar portion adjacent to the second substrate, and a projection of the bending portion in a vertical direction falls within the second substrate. A tiled display device including multiple display panels and a manufacturing method of the display panel are also provided.

17 Claims, 10 Drawing Sheets

10

(51) Int. Cl.

| | |
|---|---|
| *H01L 33/62* | (2010.01) |
| *H10D 86/01* | (2025.01) |
| *H10D 86/40* | (2025.01) |
| *H10H 20/01* | (2025.01) |
| *H10H 20/857* | (2025.01) |
| *H10H 29/45* | (2025.01) |
| *H10H 29/49* | (2025.01) |
| *H10H 29/85* | (2025.01) |
| *H10W 90/00* | (2026.01) |
| *H10D 86/60* | (2025.01) |
| *H10W 72/30* | (2026.01) |
| *H10W 72/90* | (2026.01) |
| *H10W 74/15* | (2026.01) |

(52) U.S. Cl.
CPC ........ *H10H 20/019* (2025.01); *H10H 20/857* (2025.01); *H10H 29/45* (2025.01); *H10H 29/49* (2025.01); *H10H 29/8508* (2025.01); *H10D 86/60* (2025.01); *H10W 72/383* (2026.01); *H10W 72/90* (2026.01); *H10W 74/15* (2026.01); *H10W 90/724* (2026.01); *H10W 90/734* (2026.01)

(56) References Cited

U.S. PATENT DOCUMENTS

| | | | |
|---|---|---|---|
| 2013/0342779 A1 | 12/2013 | Jung et al. | |
| 2019/0305073 A1* | 10/2019 | Chen ................... | H01L 25/0753 |
| 2020/0251457 A1* | 8/2020 | Huang ................ | H01L 25/0753 |
| 2021/0043619 A1* | 2/2021 | Liu ......................... | H01L 25/50 |
| 2022/0059608 A1 | 2/2022 | Tseng et al. | |
| 2022/0087011 A1* | 3/2022 | Harada .................. | H05K 1/024 |
| 2024/0206070 A1* | 6/2024 | Lin .......................... | H05K 1/18 |

FOREIGN PATENT DOCUMENTS

| | | | | |
|---|---|---|---|---|
| CN | 111430402 A | | 7/2020 | |
| CN | 113193013 A | * | 7/2021 | ............. G09F 9/301 |
| TW | 202103910 A | | 2/2021 | |

OTHER PUBLICATIONS

First Office Action, State Intellectual Property Office of People's Republic of China, Chinese Application No. CN202210638869.3, Mar. 12, 2024, all pages. (Year: 2024).*

First Office Action, Taiwan Intellectual Property Office, Taiwan Application No. 11121065880, Oct. 28, 2022, all pages. (Year: 2022).*

First Office Action (Google translation), Taiwan Intellectual Property Office, Taiwan Application No. 11121065880, Oct. 28, 2022, all pages. (Year: 2022).*

Machine translation, Huang, Chinese Pat. Pub. No. CN113193013A, translation date: Jun. 4, 2025, Espacenet, all pages. (Year: 2025).*

Office Action issued by (TIPO) Intellectual Property Office Ministry of Economic Affairs R.O.C. on Oct. 28, 2022 for Application No. 111104872, Taiwan.

Office Action issued by the State Intellectual Property Office of The Peoples Republic of China on Mar. 12, 2024 for Application No. 202210638869.3, China.

* cited by examiner

1

DISPLAY PANEL, TILED DISPLAY DEVICE INCLUDING THE SAME, AND MANUFACTURING METHOD THEREOF

CROSS-REFERENCE TO RELATED PATENT APPLICATION

This non-provisional application claims priority to and the benefit of, pursuant to 35 U.S.C. § 119(a), patent application Serial No. 111104872 filed in Taiwan on Feb. 10, 2022. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a display panel and a manufacturing method thereof, and particularly to a tiled display device including the display panel.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the rapid development of display technology, the market demand for the large format display (LFD) is also increasing. Currently, tiling technology is one of the main ways to realize the large format display.

The tiling technology is to perform tiling of a plurality of small-sized display panels to assemble a large format display. Although current technology exists in connecting back side chips utilizing side traces, when used in high-resolution designs, the configuration of the side traces still occupies a certain area, resulting in a distance between the outermost pixels and edges of the display panel being greater than the distance between the pixels, thus causing discontinuity of the display images on the large format display after tiling.

SUMMARY

The present disclosure provides a display panel and a manufacturing method thereof, which may improve the issue of discontinuity of the tiled display images.

The present disclosure provides a tiled display device, which has good display quality.

One embodiment of the present disclosure provides a display panel, which includes: a first substrate, comprising a planar portion and a bending portion; a second substrate, disposed on the first substrate; a plurality of light-emitting components, disposed on the second substrate; a bonding layer, disposed between the planar portion of the first substrate and the second substrate; and a driving component, disposed on a first surface of the bending portion of the first substrate, and electrically connected to the light-emitting components. The first surface of the bending portion extends from a surface of the planar portion adjacent to the second substrate, and a projection of the bending portion in a vertical direction falls within the second substrate.

In one embodiment of the present disclosure, an orthographic projection of the bonding layer on the first substrate is located out of the bending portion.

In one embodiment of the present disclosure, the bending portion has a L-shaped or U-shaped contour.

In one embodiment of the present disclosure, the first substrate comprises a plurality of active components, and the active components are disposed on the planar portion.

In one embodiment of the present disclosure, the second substrate is a printed circuit board or a through glass vias substrate.

In one embodiment of the present disclosure, the bonding layer further comprises a conductive structure, and the conductive structure is electrically connected to the first substrate and the second substrate.

In one embodiment of the present disclosure, the bonding layer further comprising a supporting member, disposed at a side of the conductive structure.

In one embodiment of the present disclosure, the display panel further includes a first protective layer, covering the light-emitting components.

In one embodiment of the present disclosure, the first protective layer further covers a side surface of the second substrate.

In one embodiment of the present disclosure, a projection of the driving component in the vertical direction falls within the first protective layer.

In one embodiment of the present disclosure, the display panel further includes a fixing member, surrounded by the planar portion and the bending portion of the first substrate.

In one embodiment of the present disclosure, the display panel further includes a third substrate, surrounded by the planar portion and the bending portion of the first substrate.

In one embodiment of the present disclosure, the display panel further includes a buffer member, disposed between the third substrate and the bending portion.

One embodiment of the present disclosure provides a tiled display device, which includes two of the display panels as described above.

In one embodiment of the present disclosure, each of the display panels has a first side edge and a second side edge opposite to each other, and the second side edge of one of the display panels is adjacent to the second side edge of the other of the display panels.

In one embodiment of the present disclosure, each of the display panels has a first side edge and a second side edge opposite to each other, and the first side edge of one of the display panels is adjacent to the second side edge of the other of the display panels.

In one embodiment of the present disclosure, the tiled display device further includes a second protective layer, covering the two display panels.

In one embodiment of the present disclosure, the second protective layer further extends between the second substrates of the two display panels.

One embodiment of the present disclosure provides a manufacturing method of a display panel, which includes: forming a first substrate on a carrier, wherein the first substrate has a planar portion and a to-be-bent portion; forming a plurality of light-emitting components on a second substrate; forming a bonding layer between the planar portion of the first substrate and the second substrate;

forming a driving component on the to-be-bent portion of the first substrate; removing at least a portion of the carrier adjacent only to the to-be-bent portion; and bending the to-be-bent portion toward a direction away from the light-emitting components to form a bending portion.

In one embodiment of the present disclosure, the driving component is formed on a surface of the to-be-bent portion adjacent to the second substrate.

In one embodiment of the present disclosure, the step of removing at least the portion of the carrier adjacent only to the to-be-bent portion further comprises removing a portion of the carrier adjacent to the planar portion.

In one embodiment of the present disclosure, the to-be-bent portion is bent to be L-shaped or U-shaped.

In one embodiment of the present disclosure, the manufacturing method further includes, prior to forming the first substrate on the carrier, forming a plurality of active components on the planar portion of the first substrate.

In one embodiment of the present disclosure, the manufacturing method further includes, after forming the light-emitting components on the second substrate, forming a first protective layer on the light-emitting components.

In one embodiment of the present disclosure, the manufacturing method further includes, prior to bending the to-be-bent portion toward the direction away from the light-emitting components, forming a fixing member on a surface of the planar portion of the first substrate away from the second substrate.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1A:
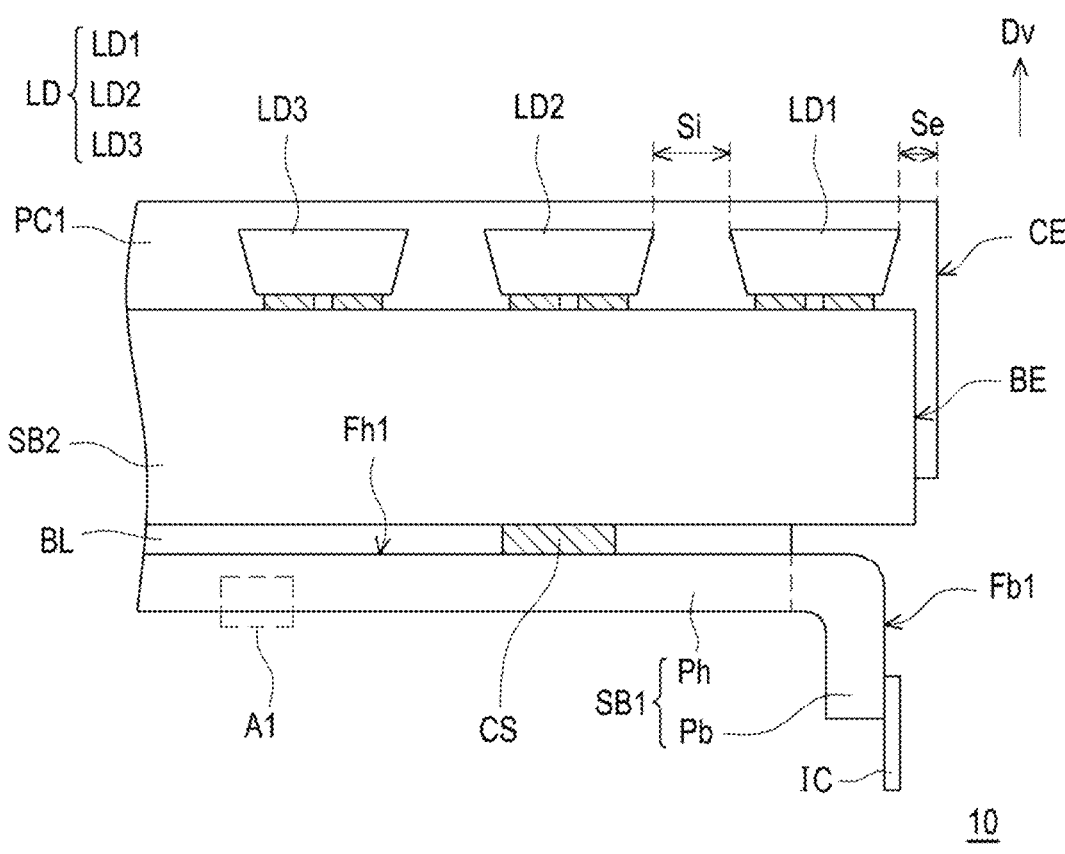
FIG. 1A is a partial sectional schematic view of a display panel 10 according to one embodiment of the present disclosure.

In the accompanying drawings, for clarity, the thickness of elements is enlarged. In the entire specification, a same reference numeral represents a same element. It should be understood that when an element such as a layer, a film, a region or a substrate is "disposed on another element", "connected to another element", "overlapped with another element", or the like, the element may be directly disposed on the another element or connected to the another element, or an intermediate element may also exist between the two elements. In contrast, when an element is "directly disposed on another element" or "directly connected to another element", no intermediate element exists. As used herein, a "connection" may be a physical and/or electrical connection. In addition, when two elements are "electrically connected" or "coupled", other elements may exist between the two elements.

It should be understood that terms such as "first", "second", and "third" are used to describe various elements, components, regions, layers and/or portions herein. However, these elements, components, regions, layers and/or parts should not be limited by these terms. These words are only used for distinguishing between an element, a component, a region, a layer and/or a part from another element, component, region, layer and/or portion. Therefore, a first "element", "component", "region", "layer" and/or "portion" hereinafter may also be referred to as a second "element", "component", "region", "layer" and/or "portion" without departing from the concept of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The detailed features and advantages of the present disclosure are described below in great detail through the following embodiments, and the content of the detailed description is sufficient for persons skilled in the art to understand the technical content of the present invention and to implement the present invention there accordingly. In other words, in certain embodiments of the present disclosure, the detailed implementation may be unnecessary. For clarity purposes, the thicknesses of layers and areas in the drawings may be exaggerated, and identical reference characters are used to indicate identical components in the description of the drawings.

The terms "about", "approximately" or "substantially" as used herein shall cover the values and value ranges described, and cover an acceptable deviation range of the specific values ascertained by one of ordinary skill in the art, where the deviation range may be determined by specific quantities of errors related to the measurement, and the errors are determined by the limitations of the measuring system or the manufacturing process conditions. In addition, the term "about" represents within one or more standard deviations of a given value of range, such as within ±30 percent, within ±20 percent, within ±10 percent or within ±5 percent. Moreover, the terms "about", "approximately" or "substantially" as used herein may selectively refer to a more acceptable deviation range or the standard deviation based on the optical characteristics, the etching characteristic, the mechanical characteristics or other characteristics, without applying one standard deviation to all characteristics such as the optical characteristics, the etching characteristic, the mechanical characteristics or other characteristics.

Unless otherwise defined, all terms (comprising technical terms and scientific terms) used herein have meanings the same as those usually understood by a person of ordinary skill in the art of the present invention. It is further understood that those terms defined in commonly used dictionaries should be explained with meanings consistent with meanings of the terms in related technology and the context of the present invention, and are not explained with ideal or excessively formal meanings, unless clearly defined herein.

Herein, exemplary embodiments are described with reference to sectional views of schematic diagrams of ideal embodiments. Therefore, changes of shapes in drawings that are used as results of manufacturing technology, tolerances, and/or the like may be expected. Therefore, herein, the embodiments should not be explained to be limited to particular shapes of regions herein, but instead, comprise shape deviations caused by manufacturing and the like. For example, regions that are shown or described to be flat may usually have rough and/or nonlinear features. In addition, a shown acute angle may be rounded. Therefore, regions in the drawings are essentially schematic, and shapes of the regions are not intended to show precise shapes of the regions and are not intended to limit the scope of the claims.

Figure 1B:
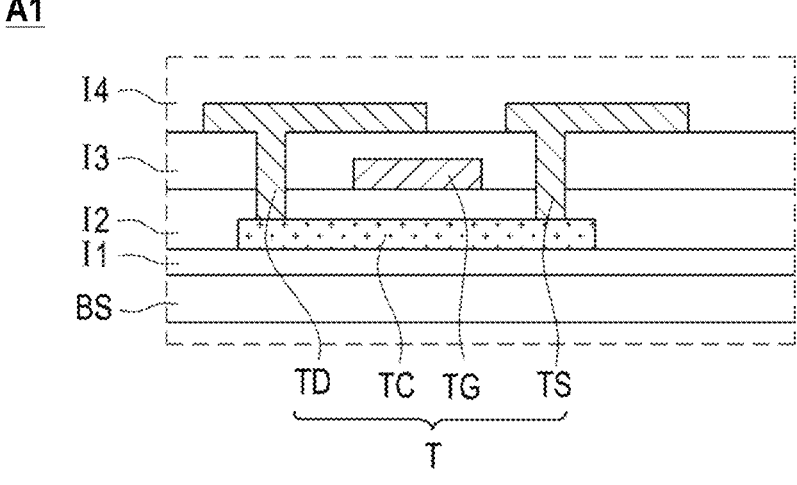
FIG. 1B is an enlarged schematic view of an area A1 of the display panel 10 of FIG. 1A.

FIG. 1A is a partial sectional schematic view of a display panel 10 according to one embodiment of the present disclosure. FIG. 1B is an enlarged schematic view of an area A1 of the display panel 10 of FIG. 1A. Firstly, referring to FIG. 1A, the display panel 10 includes: a first substrate SB1, including a planar portion Ph and a bending portion Pb; a second substrate SB2, disposed on the first substrate SB1; a plurality of light-emitting components LD, disposed on the second substrate SB2; a bonding layer BL, disposed between the planar portion Ph of the first substrate SB1 and the second substrate SB2; and a driving component IC, disposed on a first surface Fb1 of the bending portion Pb of the first substrate SB1, and electrically connected to the light-emitting components LD. The first surface Fb1 of the bending portion Pb extends from a surface Fh1 of the planar portion Ph adjacent to the second substrate SB2, and a projection of the bending portion Pb in a vertical direction Dv falls within the second substrate SB2.

Referring simultaneously to FIG. 1A and FIG. 1B, in the present embodiment, the first substrate SB1 may be an active component array substrate, such as a low temperature polysilicon (LTPS) active component array substrate, without being limited thereto. For example, the planar portion Ph of the first substrate SB1 may be disposed with an active component array, where the active component array may include a plurality of active components T arranged in an array, and the active components T may be disposed corresponding to the light-emitting components LD, or the active components T may be electrically connected to the light-emitting components LD respectively, thus individually controlling each light-emitting component LD to turn on and turn off.

In certain embodiments, the active components T may be disposed on a bottom plate BS, and each active component T may be a switch component formed by a semiconductor layer TC, a gate TG, a source TS and a drain TD. An insulating layer I1 is disposed between the bottom plate BS and the semiconductor layer TC, an insulating layer I2 is disposed between the gate TG and the semiconductor layer TC, an insulating layer I3 is disposed between the source TS, the drain TD and the gate TG, and an insulating layer I4 is disposed on the source TS and the drain TD. An area of the semiconductor layer TC overlapping with the gate TG may serve as a channel layer of the switch component T. The source TS and the drain TD may be respectively connected to the two ends of the semiconductor layer TC, and the drain TD may be electrically connected to the light-emitting component LD. When the gate TG receives a signal from the driving component IC to turn on the switch component T, the signals from the driving component IC received by the source TS may be transmitted to the light-emitting component LD.

The bottom plate BS may have a mechanical strength to a certain degree, allowing a plurality of film layers and/or a plurality of component to be disposed thereon. In certain embodiments, the bottom plate BS may be a transparent substrate, an opaque substrate, a flexible substrate or an inflexible substrate, and the material thereof may be glass, polymer, ceramic or other suitable materials.

In the present embodiment, the planar portion Ph of the first substrate SB1 may refer to a section overlapped with the bonding layer BL, and the section not overlapped with the bonding layer BL is the bending portion Pb. In other words, the first substrate SB1 may be divided into the planar portion Ph and the bending portion Pb based on being overlapped with the bonding layer or not, and an orthographic projection of the bonding layer BL on the first substrate SB1 is located out of the bending portion Pb. In certain embodiments, the bending portion Pb may have a L-shaped contour, without being limited thereto.

In the present embodiment, the second substrate SB2 may be a circuit substrate, such as a printed circuit board (PCB), without being limited thereto. The second substrate SB2 may be used to support and dispose a plurality of light-emitting components LD, and the light-emitting components LD may be electrically connected to the corresponding traces or circuit structures in the second substrate SB2 respectively.

The light-emitting components LD may include light-emitting diode components, and different light-emitting components LD may emit light in different colors, without being limited thereto. For example, in the present embodiment, the light-emitting components LD may include light-emitting components LD1, LD2, LD3, where each light-emitting component LD1 may be, for example, a red light-emitting diode, each light-emitting component LD2 may be, for example, a green light-emitting diode, and each light-emitting component LD3 may be, for example, a blue light-emitting diode, without being limited thereto. In certain embodiments, the light-emitting components LD1, LD2, LD3 may altogether constitute a pixel of the display panel 10.

The bonding layer BL may be sandwiched between the planar portion Ph of the first substrate SB1 and the second substrate SB2. In other words, the second substrate SB2 may be fixed to the surface Fh1 of the planar portion Ph of the first substrate SB1 by the bonding layer BL. The bonding layer BL may further include a conductive structure CS, and the conductive structure CS may be electrically connected to the first substrate SB1 and the second substrate SB2.

In the present embodiment, the driving component IC may be disposed on the surface Fb1 of the bending portion Pb, and the driving component IC may be disposed at one end of the bending portion Pb away from the planar portion Ph. Further, the driving component IC may be electrically connected to the light-emitting components LD through the traces and/or circuit structures in the first substrate SB1, the conductive structure CS of the bonding layer BL, and the traces and/or circuit structures in the second substrate SB2.

Since the projection of the bending portion Pb in the vertical direction Dv falls within the second substrate SB2, the bending portion Pb does not protrude out of a side surface BE of the second substrate SB2. Thus, the bending portion Pb may be prevented from affecting the tiling of the display panel 10.

In certain embodiments, the projection of the bending portion Pb in the vertical direction Dv may fall within the second substrate SB2, thus ensuring that the driving component IC and the bending portion Pb do not protrude out of the side surface BE of the second substrate SB2, thereby preventing the driving component IC and the bending portion Pb from affecting the tiling of the display panel 10.

In certain embodiments, the display panel 10 may further include a protective layer PC1, and the protective layer PC1 may cover the light-emitting components LD, thus preventing the light-emitting components LD from being damaged. In certain embodiments, the protective layer PC1 may further cover the side surface BE of the second substrate SB2, and a side surface CE of the protective layer PC1 may protrude out of the side surface BE of the second substrate SB2. In other words, the side surface CE of the protective layer PC1 may be the outermost edge of the whole display panel 10. In certain embodiments, a projection of the driving component IC in the vertical direction Dv may be within the protective layer PC1, thus ensuring that the driving component IC and the bending portion Pb do not protrude out of the side surface CE of the protective layer PC1, thereby preventing the driving component IC and the bending portion Pb from affecting the tiling of the display panel 10.

In certain embodiments, a distance Se between the side surface CE and the light-emitting component being most adjacent to the side surface CE may be less than or equal to one half of the distance Si between the light-emitting components LD1, LD2, LD3, such that after the two display panels 10 are tiled, the distance between the light-emitting components LD at two sides of the tiling gap may be approximately a distance Si between the light-emitting components LD in the individual display panel 10.

Other embodiments of the present disclosure are hereinafter described with reference to FIG. 2A to FIG. 8, using the component reference numbers and related contents in the embodiments of FIG. 1A to FIG. 1B, where identical reference numbers indicate identical or similar components, and descriptions of the identical technical contents are omitted. The descriptions of the omitted parts may be referred to in the embodiments of FIG. 1A to FIG. 1B, and are not hereinafter elaborated.

Figure 2A:
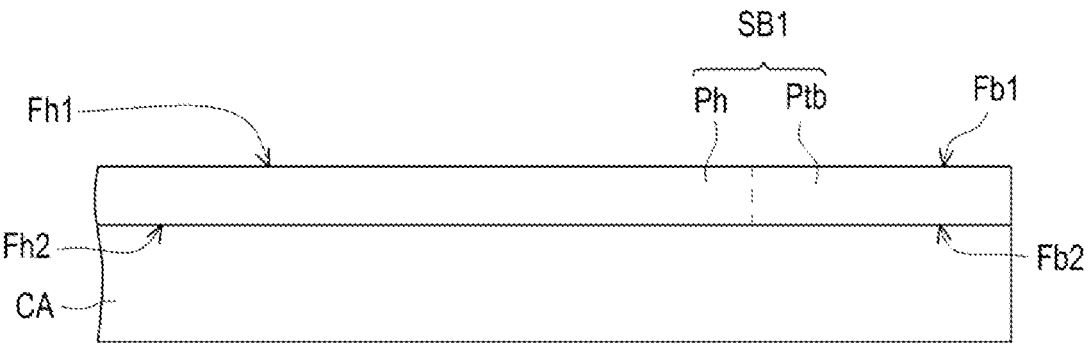
FIG. 2A to FIG. 2F are partial sectional schematic views of the steps of a manufacturing method of the display panel 10 as shown in FIG. 1A.

FIG. 2A to FIG. 2F are partial sectional schematic views of the steps of a manufacturing method of the display panel 10 as shown in FIG. 1A. Referring to FIG. 2A, in the manufacturing method of the display panel of the present embodiment, the first substrate SB1 is formed on a carrier CA. In details, the first substrate SB1 may be divided into the planar portion Ph and the to-be-bent portion Ptb, where the planar portion Ph has a surface Fh1 and a surface Fh2 opposite to each other, and the to-be-bent portion Ptb has a surface Fb1 and a surface Fb2 opposite to each other. The surface Fh1 and the surface Fb1 may be on the same plane. In other words, the surface Fb1 may extend from the surface Fh1. Further, the surface Fb2 may extend from the surface Fh2 and be in contact with the carrier CA.

In certain embodiments, a plurality of active components may be pre-formed on the planar portion Ph of the first substrate SB1, and then the first substrate SB1 is formed on the carrier CA. The active components may be formed on the first substrate SB1 in an array. In other words, the first substrate may be an active component array substrate.

Figure 2B:
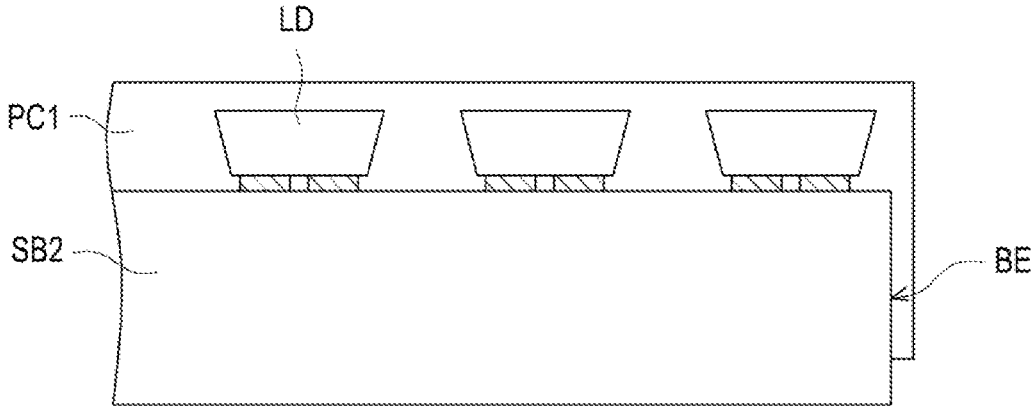

Then, referring to FIG. 2B, a plurality of light-emitting components LD are formed on the second substrate SB2, and the light-emitting components LD may be electrically connected to the traces or conductive structures in the second substrate SB2. In certain embodiments, after forming the light-emitting components LD on the second substrate SB2, a protective layer PC1 may be formed on the light-emitting components LD. The protective layer PC1 may cover the light-emitting components LD, thus preventing the light-emitting components LD from being damaged. In certain embodiments, the protective layer PC1 may further extend to the side surface of the second substrate SB2 to cover the side surface BE of the second substrate SB2.

Figure 2C:
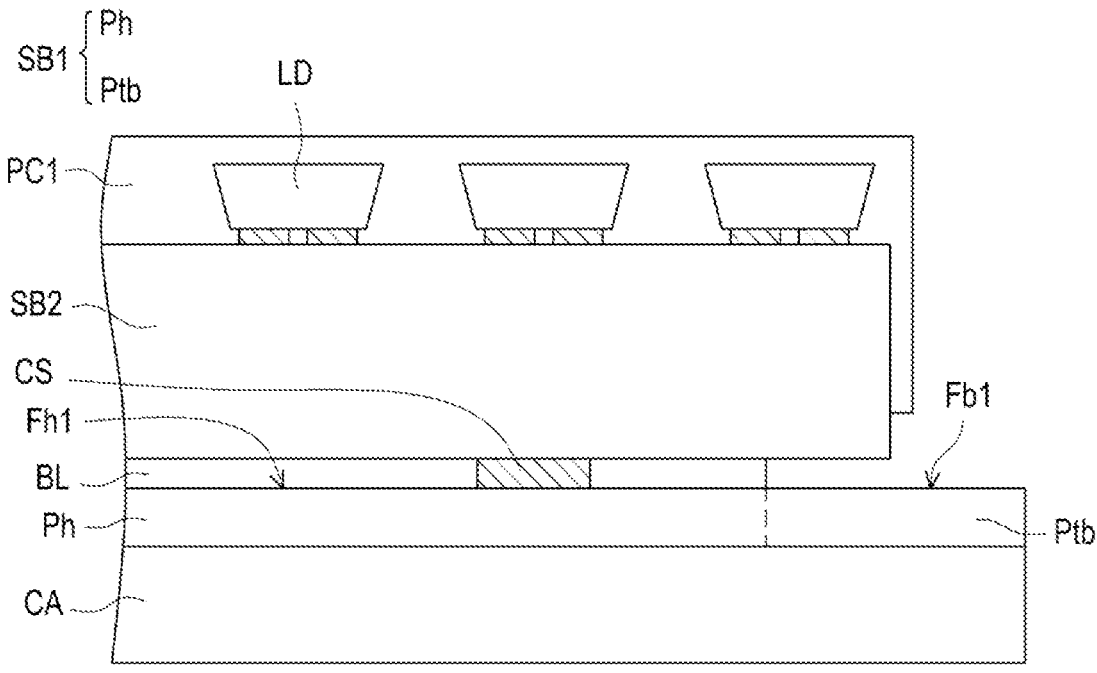

Then, referring to FIG. 2C, a bonding layer BL is formed between the planar portion Ph of the first substrate SB1 and the second substrate SB2, and the bonding layer BL is not formed on the surface Fb1 of the to-be-bent portion Ptb of the first substrate SB1. In certain embodiments, the conductive structure CS may be formed in the bonding layer BL, thus establishing the electrical connection between the first substrate SB1 and the second substrate SB2. The conductive structure CS may include metal, alloys or stacked layers thereof with good electrical conductivity, without being limited thereto.

Figure 2D:
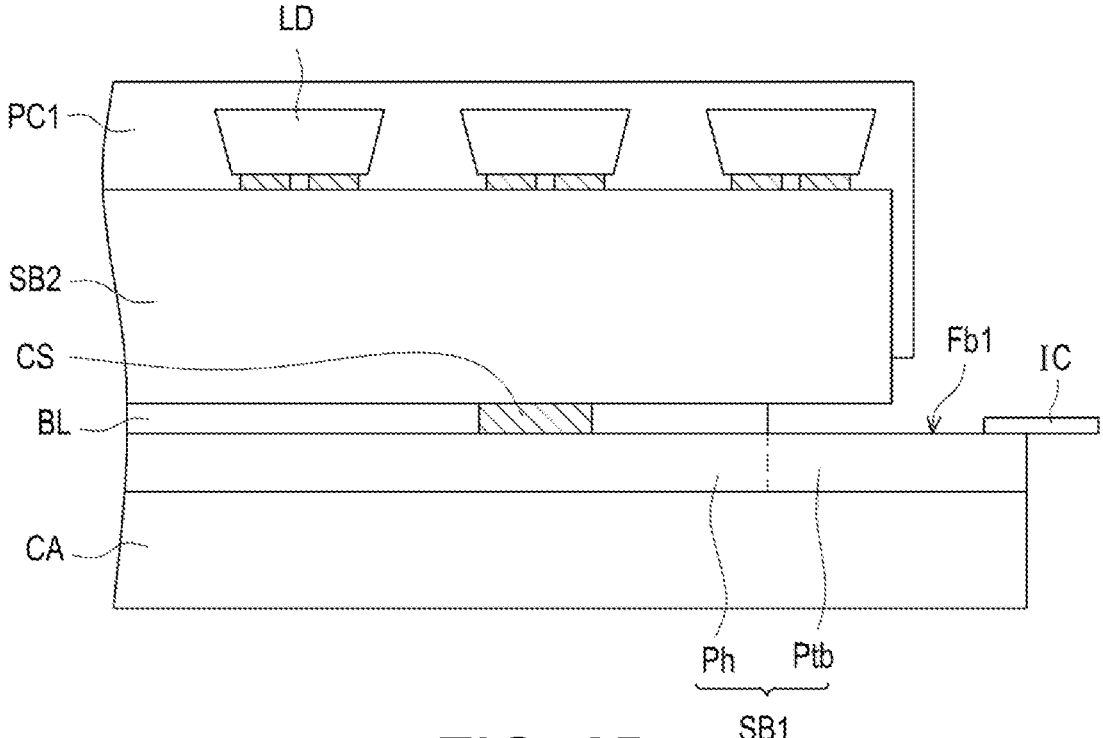

Then, referring to FIG. 2D, a driving component IC is formed on the surface Fb1 of the to-be-bent portion Ptb of the first substrate SB1. That is, the driving component IC is formed on the surface Fb1 of the to-be-bent portion Ptb adjacent to the second substrate SB2, and the driving component IC is electrically connected to the first substrate SB1. In this step, when the driving component IC is formed, the to-be-bent portion Ptb of the first substrate SB1 is supported by the carrier, so the electrical connection between the driving component IC and the first substrate SB1 may have enhanced reliability.

Figure 2E:
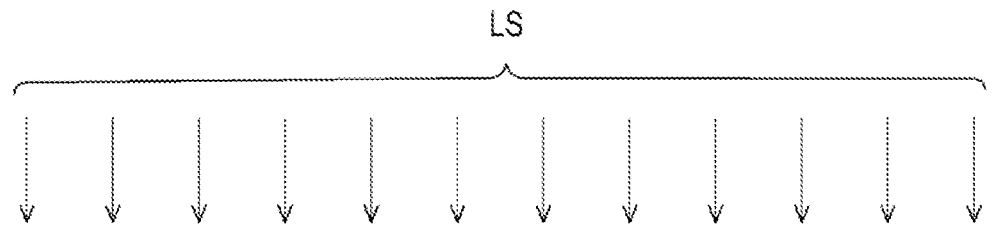
Figure 2E:
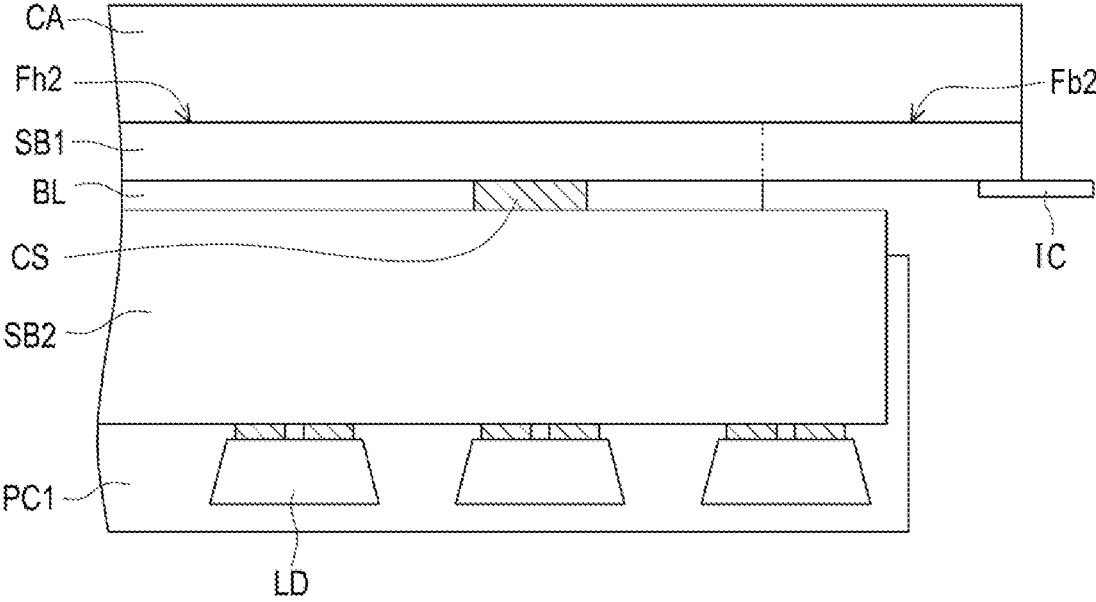

Then, referring to FIG. 2E, a laser beam LS is used to perform laser liftoff on the interface between the carrier CA and the surface Fh2 and the surface Fb2 of the first substrate SB1, such that the carrier CA may be removed from the first substrate SB1, without being limited thereto. In other embodiments, the carrier CA may be removed from the first substrate SB1 using, for example, heat treatment or other suitable methods.

Figure 2F:
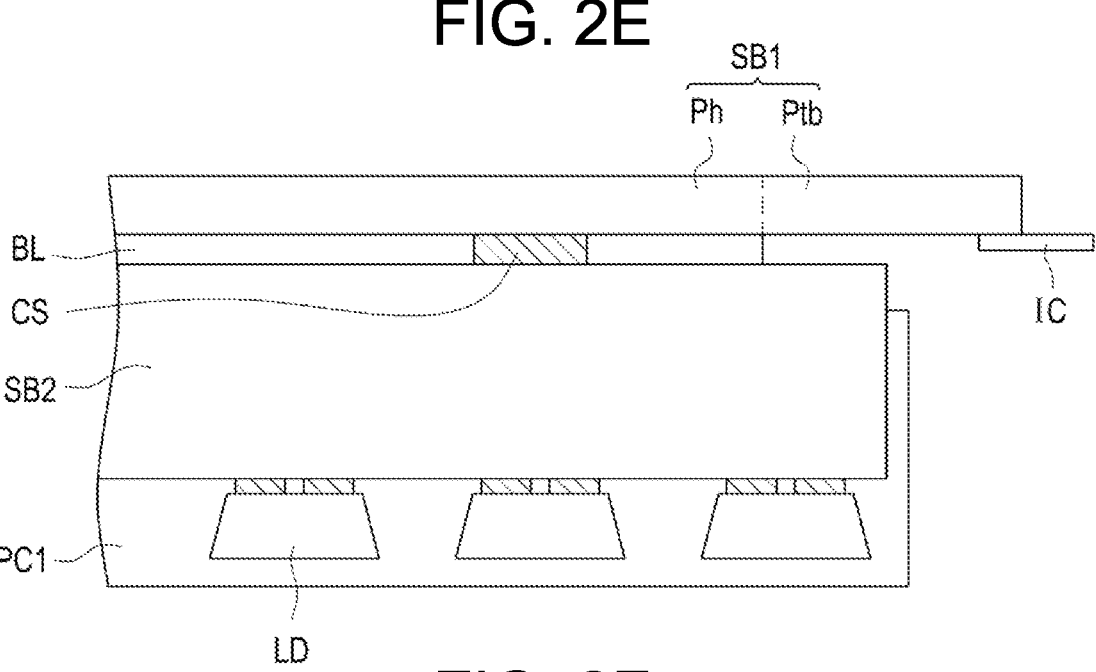

Then, referring to FIG. 2F, the whole carrier CA may be removed from the first substrate SB1, that is, the portion of the carrier CA adjacent to the to-be-bent portion Ptb and the portion thereof adjacent to the planar portion Ph are removed. Then, the to-be-bent portion Ptb of the first substrate SB1 is bent toward a direction away from the light-emitting components LD to form a L-shaped bending portion Pb, thus completing the manufacturing of the display panel 10 as shown in FIG. 1A.

Figure 3:
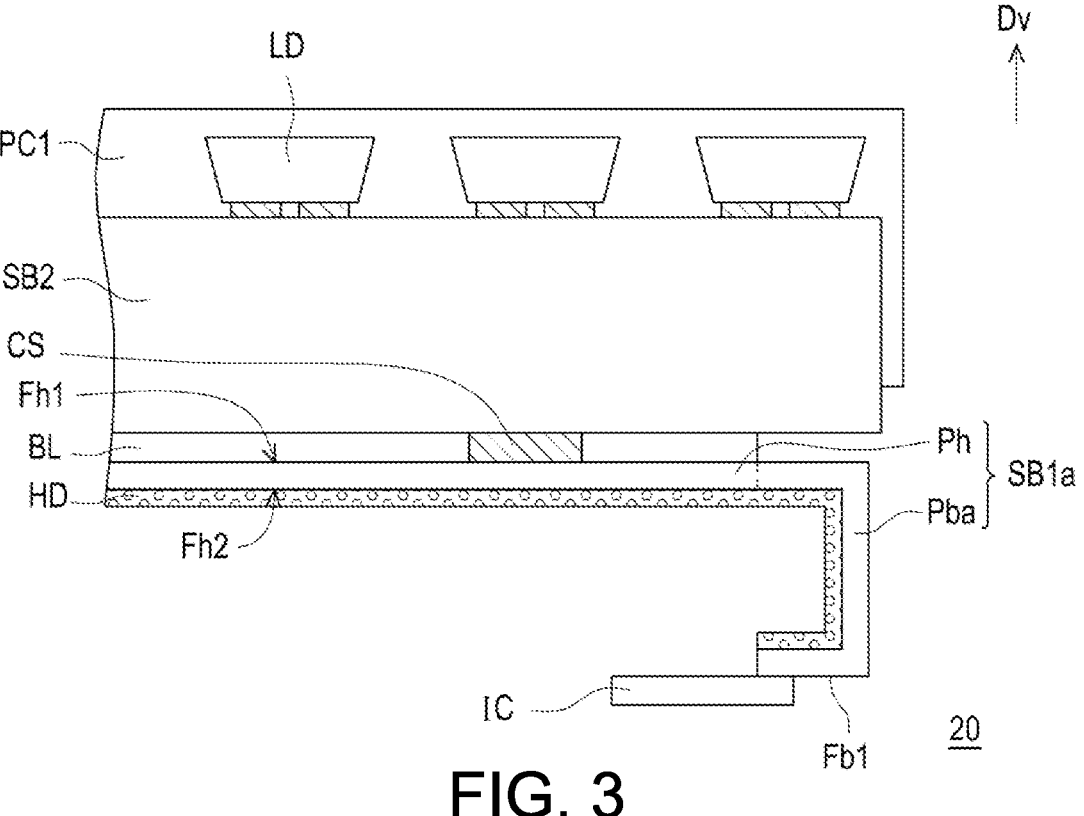
FIG. 3 is a partial sectional schematic view of a display panel 20 according to one embodiment of the present disclosure.

FIG. 3 is a partial sectional schematic view of a display panel 20 according to one embodiment of the present disclosure. The display panel 20 includes: a first substrate SB1a, including a planar portion Ph and a bending portion Pba; a second substrate SB2, disposed on the first substrate SB1a; a plurality of light-emitting components LD, disposed on the second substrate SB2; a protective layer PC1, covering the light-emitting components LD; a bonding layer BL, disposed between the planar portion Ph of the first substrate SB1a and the second substrate SB2; and a driving component IC, disposed on a first surface Fb1 of the bending portion Pba of the first substrate SB1a, and electrically connected to the light-emitting components LD. The first surface Fb1 of the bending portion Pba extends from a surface Fh1 of the planar portion Ph adjacent to the second substrate SB2, and a projection of the bending portion Pba in a vertical direction Dv falls within the second substrate SB2.

Compared to the display panel 10 as shown in FIG. 1A to FIG. 1B, the differences of the display panel 20 as shown in FIG. 3 exist in that: the bending portion Pba of the first substrate SB1a of the display panel 20 may have a U-shaped contour, and the driving component IC may be located at one end of the bending portion Pba away from the planar portion Ph, such that the driving component IC may be substantially parallel to the planar portion Ph.

In the present embodiment, the display panel 20 may further include a fixing member HD, and the fixing member HD is surrounded by the planar portion Ph and the bending portion Pba of the first substrate SB1a. In other words, one end of the fixing member HD may have a U-shaped contour similar to the bending portion Pba. In the manufacturing process of the display panel 20, for example, after removing the carrier CA in FIG. 2F, the fixing member HD may be disposed on the surface Fh2 of the planar portion Ph of the first substrate SB1a away from the second substrate SB2, and then the portion other than the planar portion Ph (such as the to-be-bent portion Ptb) is bent toward the direction away from the light-emitting components LD along the U-shaped end surface of the fixing member HD, thus forming the bending portion Pba having the U-shaped contour. In certain embodiments, the fixing member HD may be manufactured by molding using a metal plate, without being limited thereto.

Figure 4:
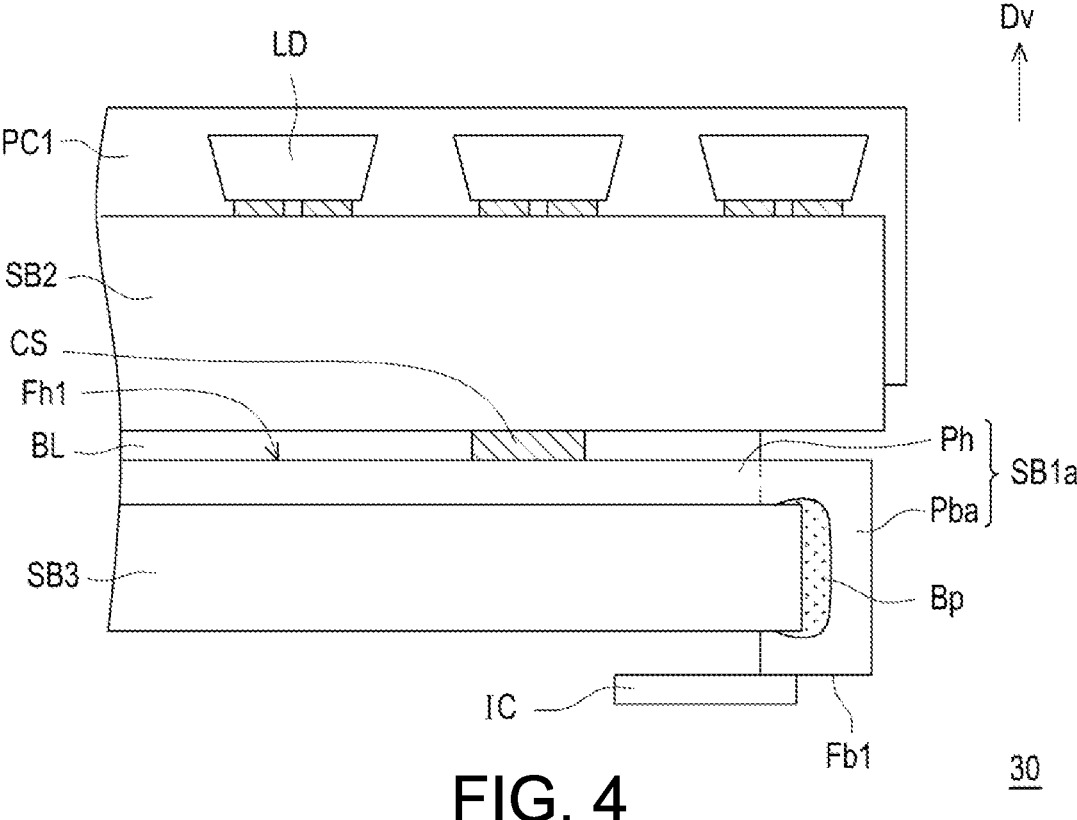
FIG. 4 is a partial sectional schematic view of a display panel 30 according to one embodiment of the present disclosure.

FIG. 4 is a partial sectional schematic view of a display panel 30 according to one embodiment of the present disclosure. The display panel 30 includes: a first substrate SB1a, including a planar portion Ph and a bending portion Pba; a second substrate SB2, disposed on the first substrate SB1a; a plurality of light-emitting components LD, disposed on the second substrate SB2; a protective layer PC1, covering the light-emitting components LD; a bonding layer BL, disposed between the planar portion Ph of the first substrate SB1a and the second substrate SB2; and a driving component IC, disposed on the surface Fb1 of the bending portion Pba of the first substrate SB1a, and electrically connected to the light-emitting components LD. The surface Fb1 of the bending portion Pba extends from a surface Fh1 of the planar portion Ph adjacent to the second substrate SB2, and a projection of the bending portion Pba in a vertical direction Dv falls within the second substrate SB2.

Compared to the display panel 20 as shown in FIG. 3, the differences of the display panel 30 as shown in FIG. 4 exist in that: the display panel 30 may use a third substrate SB3 to replace the fixing member HD. The third substrate SB3 may be, for example, a glass substrate or a ceramic substrate, without being limited thereto. In certain embodiments, the display panel 30 may further include a buffer member BP, and the buffer member BP may be disposed between the third substrate SB3 and the bending portion Pba to buffer the reaction force between the third substrate SB3 and the first substrate SB1a, or to prevent the third substrate SB3 from damaging the first substrate SB1a. The material of the buffer member BP may include materials such as protecting adhesives, without being limited thereto.

Figure 5A:
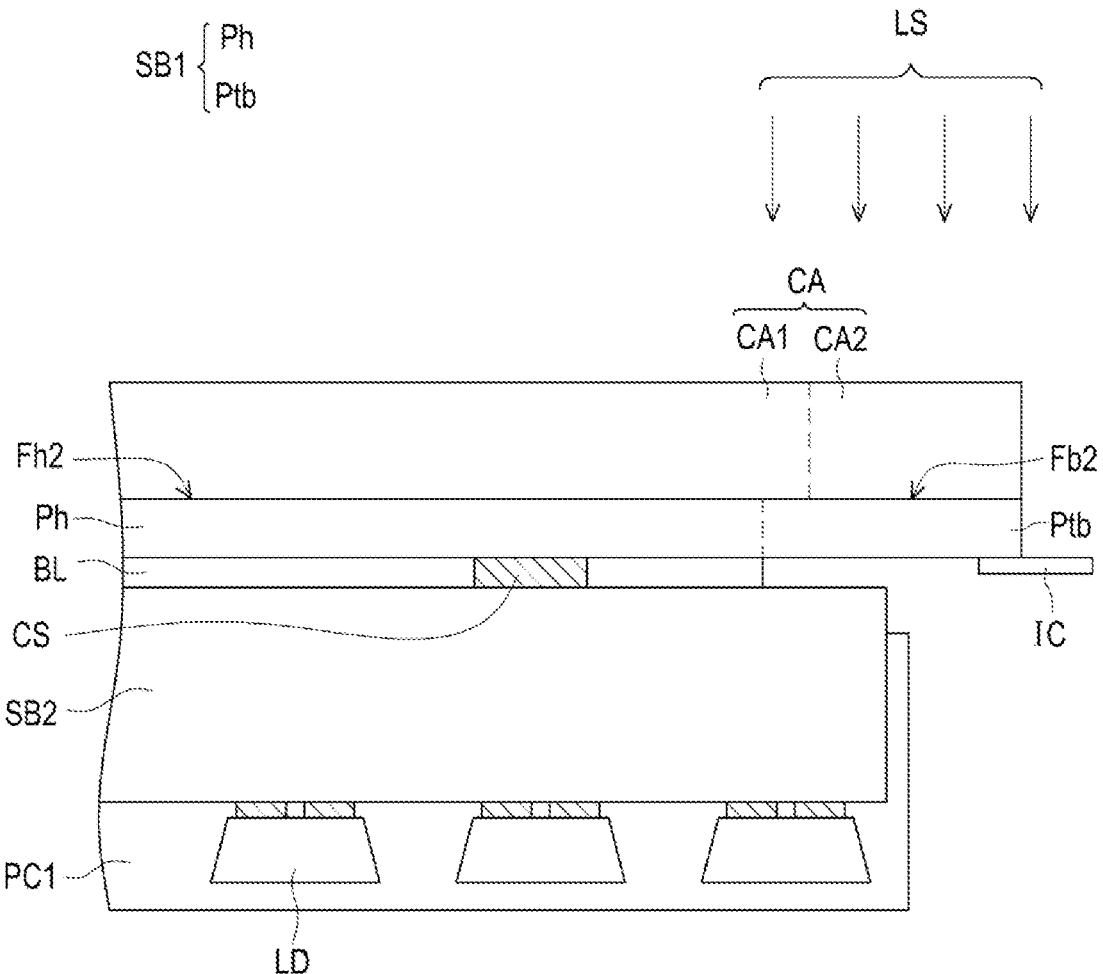
FIG. 5A to FIG. 5C are partial sectional schematic views of the steps of a manufacturing method of the display panel 30 as shown in FIG. 4.
Figure 5B:
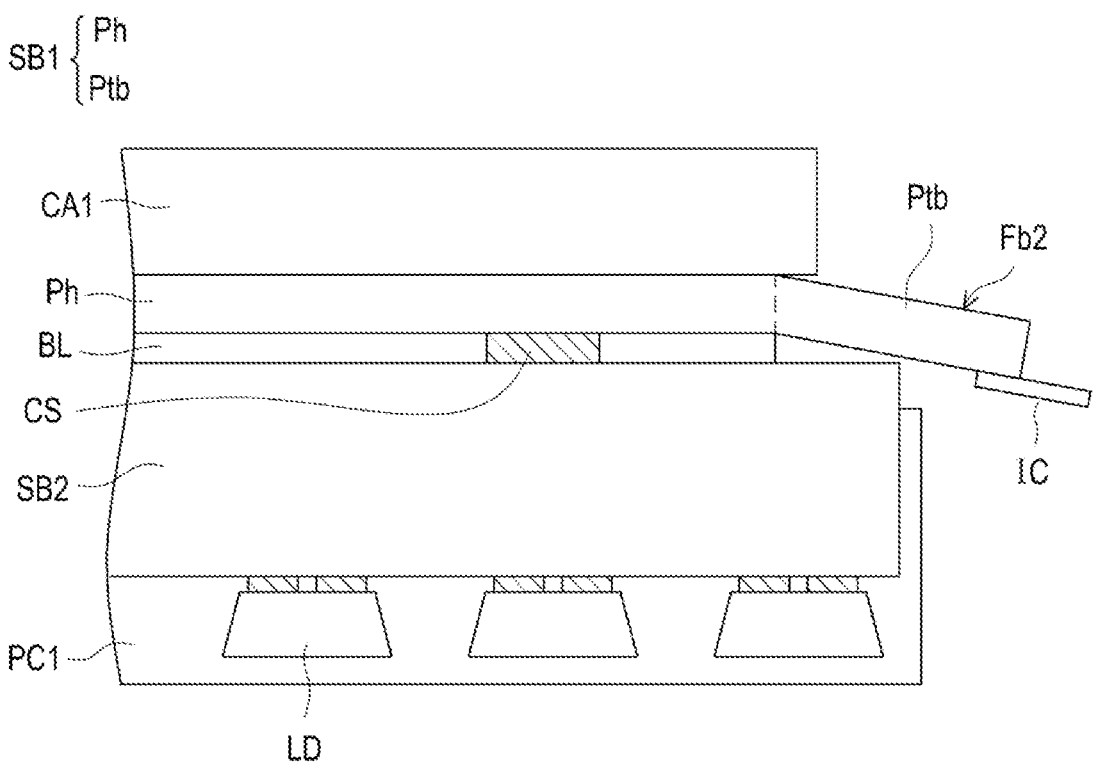
Figure 5C:
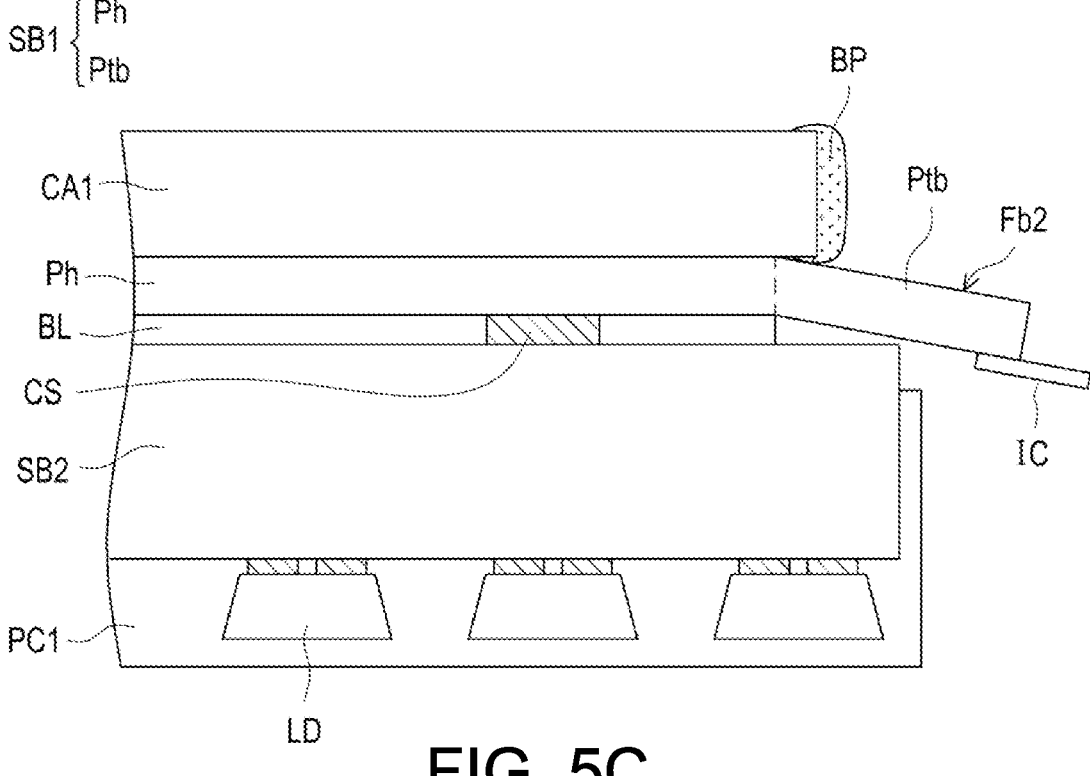

FIG. 5A to FIG. 5C are partial sectional schematic views of the steps of a manufacturing method of the display panel 30 as shown in FIG. 4. In the present embodiment, the steps as shown in FIG. 5A to FIG. 5C may be performed after the steps as shown in FIG. 2A to FIG. 2D.

Referring to FIG. 5A, a laser beam LS is used to perform laser liftoff on the interface between the carrier CA and the surface Fb2 of the to-be-bent portion Ptb of the first substrate SB1, such that a portion CA2 of the carrier CA may be easily removed from the first substrate SB1. The carrier CA may be divided into a portion CA1 and the portion CA2, where the portion CA1 is adjacent to the planar portion Ph and a small portion of the to-be-bent portion Ptb, and the portion CA2 is adjacent only to the to-be-bent portion Ptb. In other embodiments, the portion CA2 of the carrier CA may be removed from the to-be-bent portion Ptb of the first substrate SB1 using, for example, heat treatment or other suitable methods.

Then, referring to FIG. 5B, the portion CA1 and the portion CA2 of the carrier CA are divided, and the portion CA2 of the carrier CA adjacent only to the to-be-bent portion Ptb is removed from the to-be-bent portion Ptb of the first substrate SB1. Since an interface between the surface Fb2 of the to-be-bent portion Ptb and the portion CA1 of the carrier CA has been through the laser liftoff process, the to-be-bent portion Ptb is in a natural hanging state.

Then, referring to FIG. 5C, the buffer member BP may be formed at the end surface of the portion CA1 previously in contact with the portion CA2, that is, the division surface of the portion CA1 and the portion CA2, and the buffer member BP wraps the end surface. Thus, the sharp surface on the end surface generated by the division may be prevented from being exposed.

Then, the to-be-bent portion Ptb of the first substrate SB1 may be bent toward the direction away from the light-emitting components LD along the buffer member BP, thus forming the U-shaped bending portion Pba, thus completing the manufacturing of the display panel 30 as shown in FIG. 4, and the portion CA1 of the carrier CA may function as the third substrate SB3 of the display panel 30.

Figure 6:
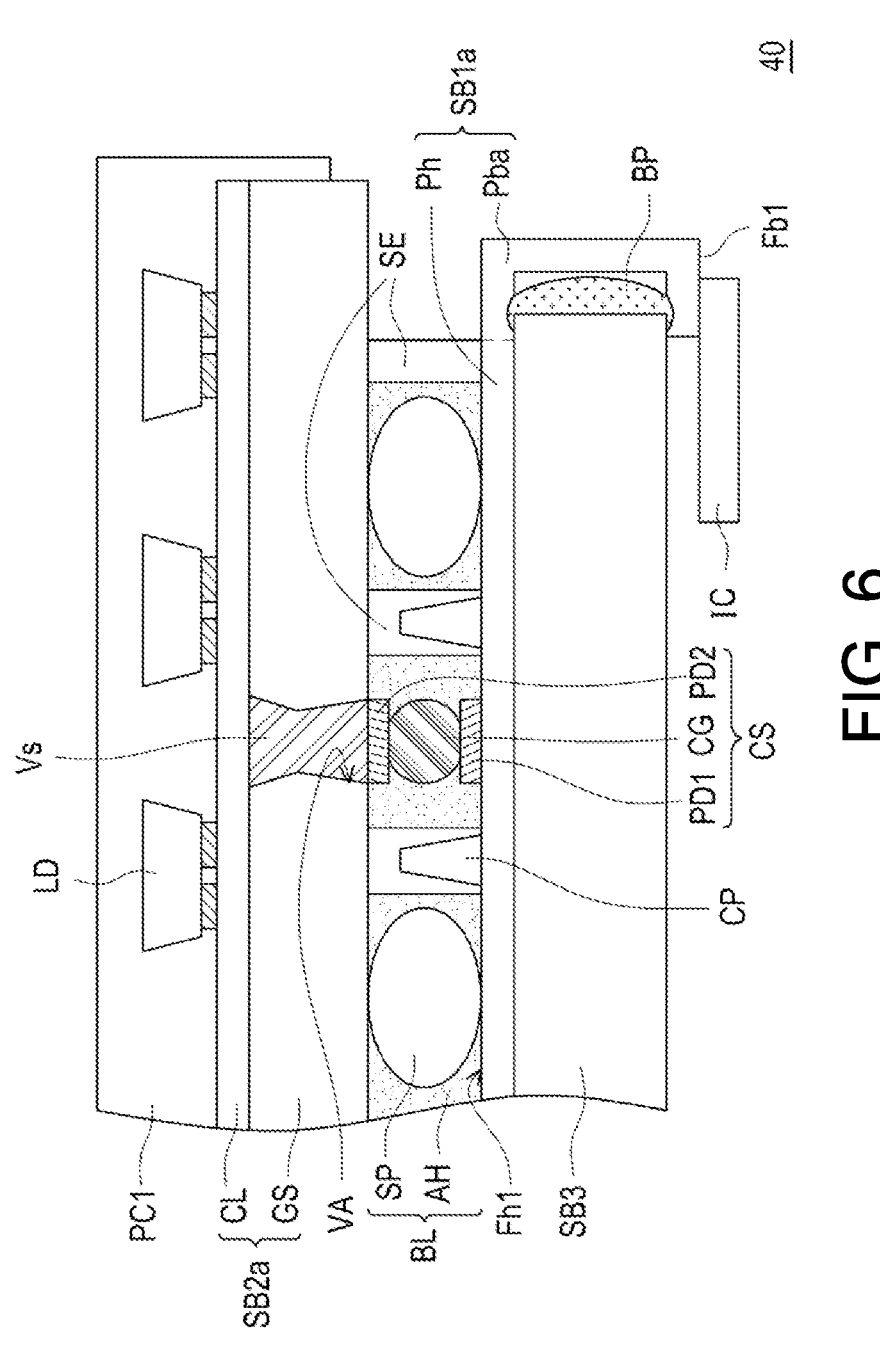
FIG. 6 is a partial sectional schematic view of a display panel 40 according to one embodiment of the present disclosure.

FIG. 6 is a partial sectional schematic view of a display panel 40 according to one embodiment of the present disclosure. The display panel 40 includes: a first substrate SB1a, including a planar portion Ph and a bending portion Pba; a second substrate SB2a, disposed on the first substrate SB1a; a plurality of light-emitting components LD, disposed on the second substrate SB2a; a protective layer PC1, covering the light-emitting components LD; a bonding layer BL, disposed between the planar portion Ph of the first substrate SB1a and the second substrate SB2a; and a driving component IC, disposed on the surface Fb1 of the bending portion Pba of the first substrate SB1a, and electrically connected to the light-emitting components LD. The surface Fb1 of the bending portion Pba extends from a surface Fh1 of the planar portion Ph adjacent to the second substrate SB2a, and a projection of the bending portion Pba in a vertical direction Dv falls within the second substrate SB2a.

Compared to the display panel 30 as shown in FIG. 4, the differences of the display panel 40 as shown in FIG. 6 exist in that: the second substrate SB2a of the display panel 40 may be a through glass vias (TGV) substrate. Specifically, the second substrate SB2a may include a glass plate GS, the glass plate GS may have a via VA through the glass, and a conductive structure Vs may be disposed in the via VA. In certain embodiments, the second substrate SB2a may further include a circuit layer CL, and the circuit layer CL may be electrically connected to the conductive structure Vs and the light-emitting components LD.

Further, in the present embodiment, the conductive structure CS of the bonding layer BL of the display panel 40 may include, for example, bonding pads PD1, PD2 and a conductive glue CG. The bonding pad PD1 may be electrically connected to the first substrate SB1a, the bonding pad PD2 may be electrically connected to the conductive structure Vs, and the conductive glue CG may be electrically connected to the bonding pad PD1 and the bonding pad PD2.

In certain embodiments, the bonding layer BL of the display panel 40 may further include a supporting member CP, where the supporting member CP provides a thickness stability for the bonding layer BL, and the supporting member CP may be located at one side or two sides of the conductive structure CS, thus preventing the conductive structure CS from being pressed by an outer force. The supporting member CP may be formed by, for example, stacking a plurality of layers of color resists, and may have a trapezoidal contour, without being limited thereto. In certain embodiments, the bonding layer BL may further include a sealing member SE, and the sealing member SE may be located at two ends of the bonding layer BL to prevent materials of the bonding layer BL from leaking out. In certain embodiments, the sealing member SE may fill the space around the supporting member CP.

In certain embodiments, the bonding layer BL may include an adhesive material AH, and the adhesive material AH may be located between any two of the conductive structure CS, the supporting member CP and the sealing member SE, thus increasing the adhesion between the first substrate SB1a and the second substrate SB2a. In certain embodiments, the adhesive material AH may further include an elastic separation object SP, and the elastic separation object SP may be distributed in the adhesive material AH. The elastic separation object SP may be both soft and supporting, thus providing suitable buffer and support for the bonding layer BL when the first substrate SB1a and the second substrate SB2a are laminated, for example.

Figure 7:
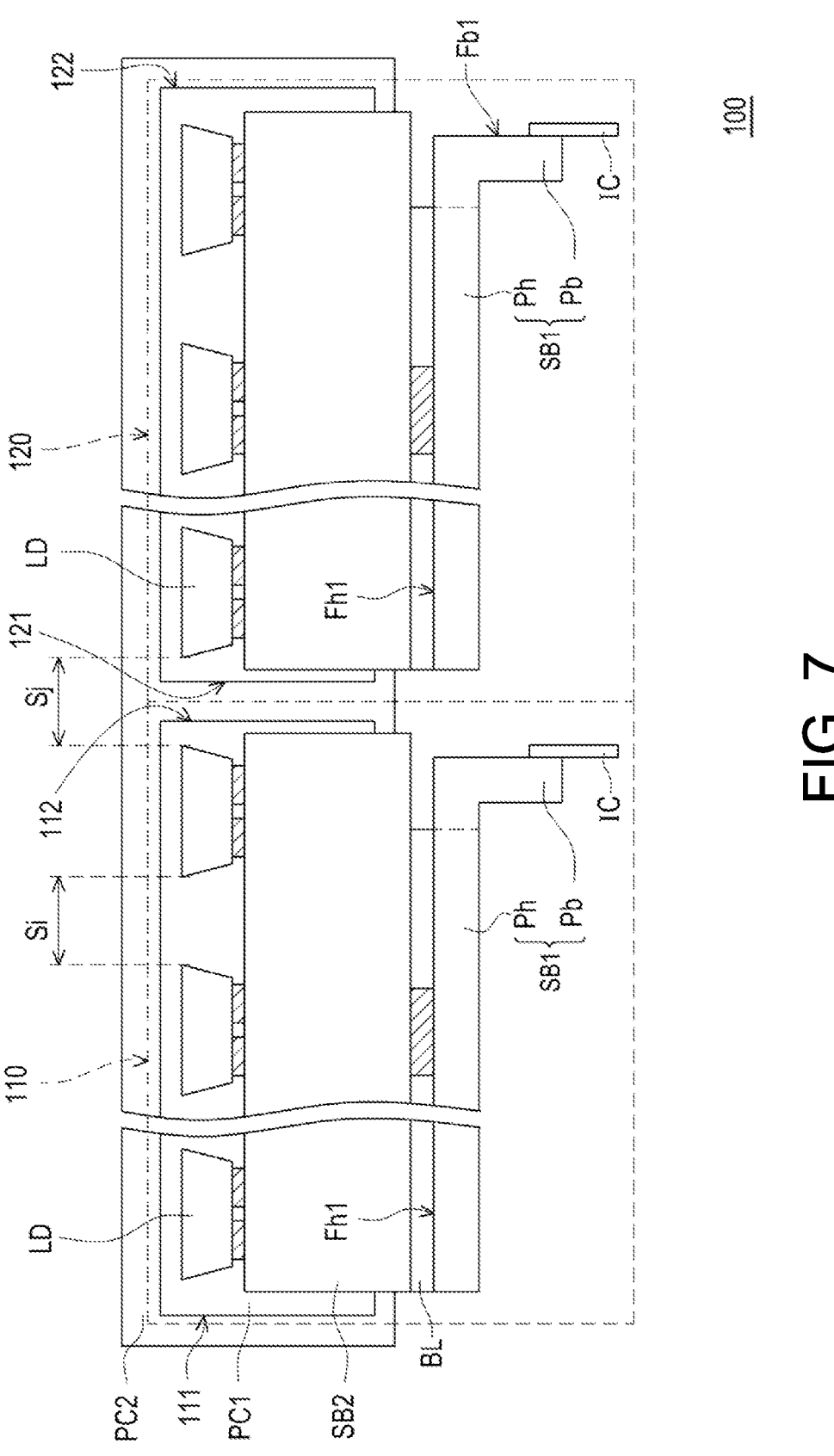
FIG. 7 is a partial sectional schematic view of a tiled display device 100 according to one embodiment of the present disclosure.

FIG. 7 is a partial sectional schematic view of a tiled display device 100 according to one embodiment of the present disclosure. In the present embodiment, the tiled display device 100 may include two identical display panels 110, 120, and each of the display panels 110, 120 may be the display panel 10 as shown in FIG. 1A, without being limited thereto. In other embodiments, the tiled display device 100 may include three or more identical or different display panels, and the display panels of the tiled display device 200 may be any one of the display panels 10, 20, 30, 40 or a combination thereof.

In the present embodiment, the display panel 110 has a first side edge 111 and a second side edge 112 opposite to each other, and the display panel 120 has a first side edge 121 and a second side edge 122 opposite to each other, where the second side edges 112, 122 are at a side adjacent to the driving components IC, and the second side edge 112 of the display panel 110 is adjacent to the first side edge 121 of the display panel 120. Further, a distance Sj between the light-emitting component LD of the display panel 110 being most adjacent to the second side edge 112 and the light-emitting component LD of the display panel 120 being most adjacent to the first side edge 121 may be approximately or substantially equal to a distance Si between the light-emitting components LD in the individual display panels 110, 120, such that the pixel distance of the tiled display device 100 may be consistent, thereby presenting good display quality.

In addition, the tiled display device 100 may further include a protective layer PC2, and the protective layer PC2 may cover the display panels 110, 120, which may help protecting or fixing the display panels 110, 120. In certain embodiments, the protective layer PC2 may extend to be located between the second substrates SB2 of the two display panels 110, 120, such that the protective layer PC2 may further prevent the light leaking from the gap between the display panels 110, 120.

Figure 8:
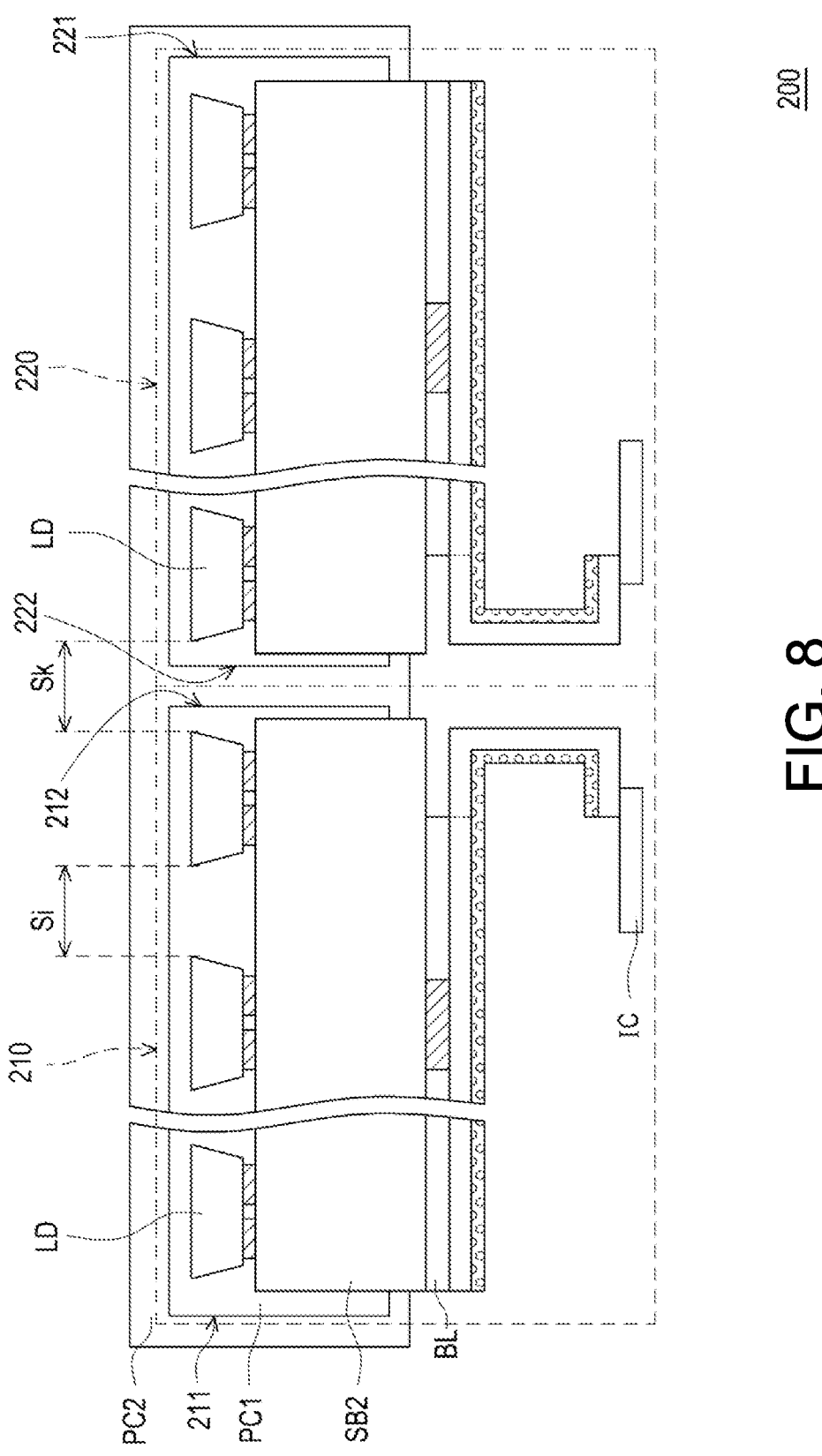
FIG. 8 is a partial sectional schematic view of a tiled display device 200 according to one embodiment of the present disclosure.

FIG. 8 is a partial sectional schematic view of a tiled display device 200 according to one embodiment of the present disclosure. The tiled display device 200 may include two identical display panels 210, 220, and each of the display panels 210, 220 may be the display panel 20 as shown in FIG. 3, without being limited thereto. In other embodiments, the tiled display device 200 may include three or more identical or different display panels, and the display panels of the tiled display device 200 may be any one of the display panels 10, 20, 30, 40 or a combination thereof.

Compared to the tiled display device 100 as shown in FIG. 7, the differences of the tiled display device 200 as shown in FIG. 8 exist in that: the display panel 210 of the tiled display device 200 has a first side edge 211 and a second side edge 212 opposite to each other, and the display panel 220 has a first side edge 221 and a second side edge 222 opposite to each other, where the second side edges 212, 222 are at a side adjacent to the driving components IC, and the second side edge 212 of the display panel 210 is adjacent to the second side edge 222 of the display panel 220. Further, a distance Sk between the light-emitting component LD of the display panel 210 being most adjacent to the second side edge 212 and the light-emitting component LD of the display panel 220 being most adjacent to the second side edge 222 may be approximately or substantially equal to a distance Si between the light-emitting components LD in the individual display panels 210, 220, such that the pixel distance of the tiled display device 200 may be consistent, thereby presenting good display quality.

In sum, in the present disclosure, the display panel has a dual substrate structure formed by the first substrate and the second substrate, in which the bending portion of the first substrate does not protrude out of a side surface of the second substrate, thus preventing the bending portion from enlarging the tiling gap of the display panel, thereby improving the issue of discontinuity of the tiling display image. Thus, the driving component disposed on the bending portion may be prevented from affecting the tiling of the display panel, thereby improving the display quality of the tiled display device.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display panel, comprising:

a first substrate, comprising a plurality of active components, a planar portion and a bending portion, wherein the active components are disposed on the planar portion;

a second substrate, disposed on the first substrate;

a plurality of light-emitting components, disposed on the second substrate;

a bonding layer, disposed between the planar portion of the first substrate and the second substrate; and a driving component, disposed on a first surface of the bending portion of the first substrate, and electrically connected to the light-emitting components, wherein the first surface of the bending portion extends from a surface of the planar portion adjacent to the second substrate, and a projection of the bending portion in a vertical direction falls within the second substrate.

2. The display panel according to claim 1, wherein an orthographic projection of the bonding layer on the first substrate is located out of the bending portion.

3. The display panel according to claim 1, wherein the bending portion has a L-shaped or U-shaped contour.

4. The display panel according to claim 1, wherein the second substrate is a printed circuit board or a through glass vias substrate.

5. The display panel according to claim 1, wherein the bonding layer further comprises a conductive structure, and the conductive structure is electrically connected to the first substrate and the second substrate.

6. The display panel according to claim 5, wherein the bonding layer further comprising a supporting member, disposed at a side of the conductive structure.

7. The display panel according to claim 1, further comprising a first protective layer, covering the light-emitting components.

8. The display panel according to claim 7, wherein the first protective layer further covers a side surface of the second substrate.

9. The display panel according to claim 8, wherein a projection of the driving component in the vertical direction falls within the first protective layer.

10. The display panel according to claim 1, further comprising a fixing member, surrounded by the planar portion and the bending portion of the first substrate.

11. The display panel according to claim 1, further comprising a third substrate, surrounded by the planar portion and the bending portion of the first substrate.

12. The display panel according to claim 11, further comprising a buffer member, disposed between the third substrate and the bending portion.

13. A tiled display device, comprising:

two of the display panels according to claim 1.

14. The tiled display device according to claim 13, wherein each of the display panels has a first side edge and a second side edge opposite to each other, and the second side edge of one of the display panels is adjacent to the second side edge of the other of the display panels.

15. The tiled display device according to claim 13, wherein each of the display panels has a first side edge and a second side edge opposite to each other, and the first side edge of one of the display panels is adjacent to the second side edge of the other of the display panels.

16. The tiled display device according to claim 13, further comprising a second protective layer, covering the two display panels.

17. The tiled display device according to claim 16, wherein the second protective layer further extends between the second substrates of the two display panels.

* * * * *